(12) United States Patent
Okamoto et al.

(10) Patent No.: US 8,117,916 B2
(45) Date of Patent: Feb. 21, 2012

(54) ELECTRONIC COMPONENT AND METHOD FOR MANUFACTURING THE SAME

(75) Inventors: Shoji Okamoto, Osaka (JP); Masahiro Yasumi, Osaka (JP); Yuuki Nakamura, Hyogo (JP); Satoshi Ohuchi, Hyogo (JP); Michihiko Hayashi, Fukui (JP)

(73) Assignee: Panasonic Corporation, Osaka (JP)

( * ) Notice: Subject to any disclaimer, the term of this patent is extended or adjusted under 35 U.S.C. 154(b) by 367 days.

(21) Appl. No.: 12/447,548

(22) PCT Filed: Nov. 12, 2007

(86) PCT No.: PCT/JP2007/071891
§ 371 (c)(1),
(2), (4) Date: Apr. 28, 2009

(87) PCT Pub. No.: WO2008/059781
PCT Pub. Date: May 22, 2008

(65) Prior Publication Data
US 2010/0043547 A1 Feb. 25, 2010

(30) Foreign Application Priority Data
Nov. 17, 2006 (JP) .................. 2006-311173

(51) Int. Cl.
G01P 9/04 (2006.01)
G01P 15/09 (2006.01)
(52) U.S. Cl. ..................... 73/504.16; 333/193
(58) Field of Classification Search .............. None
See application file for complete search history.

(56) References Cited

U.S. PATENT DOCUMENTS

| 7,010,837 | B2 * | 3/2006 | Takata et al. | 29/25.35 |
| 7,598,826 | B2 * | 10/2009 | Yamaguchi et al. | 333/187 |
| 2003/0231082 | A1 * | 12/2003 | Takata et al. | 333/193 |
| 2011/0084779 | A1 * | 4/2011 | Zhang | 333/187 |

FOREIGN PATENT DOCUMENTS

| JP | 2000-094681 A | 4/2000 |
| JP | 2001-250995 A | 9/2001 |
| JP | 2002-257549 A | 9/2002 |
| JP | 2003-188429 A | 7/2003 |
| JP | 2006-051812 A | 2/2006 |
| WO | 2004/015370 A1 | 2/2004 |

OTHER PUBLICATIONS

International Search Report for PCT/JP2007/071891.

* cited by examiner

*Primary Examiner* — Andre Allen
(74) *Attorney, Agent, or Firm* — Pearne & Gordon LLP (57) ABSTRACT

An electronic component is disclosed, and this component includes an element with an electrode section which is formed of upper electrode (74), lower electrode (72), piezoelectric unit (70) placed between upper electrode (74) and lower electrode (72), and adhesive layer (76) layered between upper electrode (74) and piezoelectric unit (70). Piezoelectric unit (70) includes piezoelectric layer (80) made of piezoelectric material containing lead, and adhesive layer (76) includes a tungsten layer made of tungsten-based material. Piezoelectric layer (80) and the tungsten layer are layered together. The structure discussed above allows preventing a piezoelectric constant from lowering and a base-point voltage from varying. The lowering and the varying have been caused by a temperature-rise.

6 Claims, 8 Drawing Sheets

ELECTRONIC COMPONENT AND METHOD FOR MANUFACTURING THE SAME

TECHNICAL FIELD

The present invention relates to an electronic component to be used in a variety of electronic devices, and it also relates to a method for manufacturing the same electronic component.

BACKGROUND ART

Figure 6:
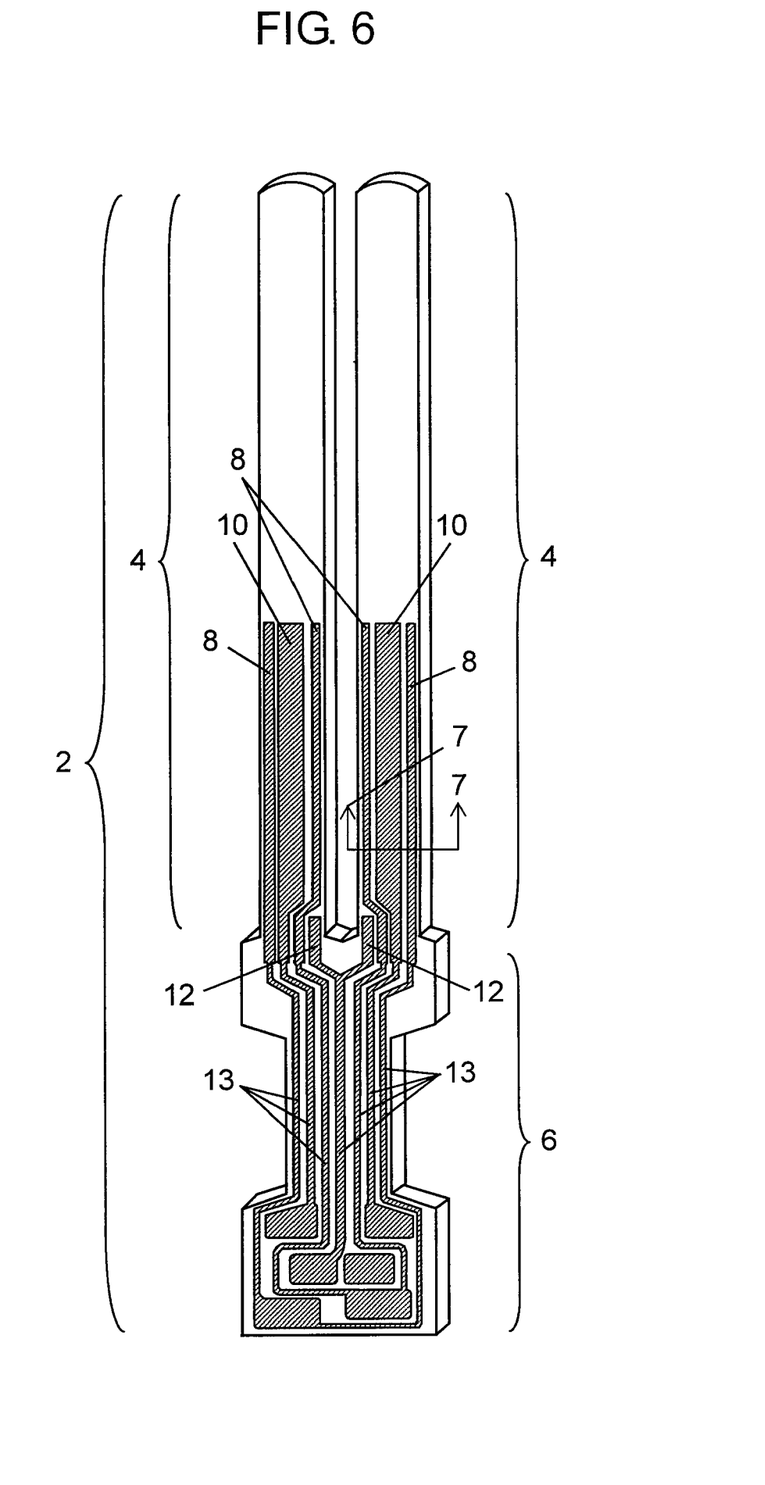
FIG. 6 shows a perspective view of a detecting element of a conventional angular velocity sensor.
Figure 7:
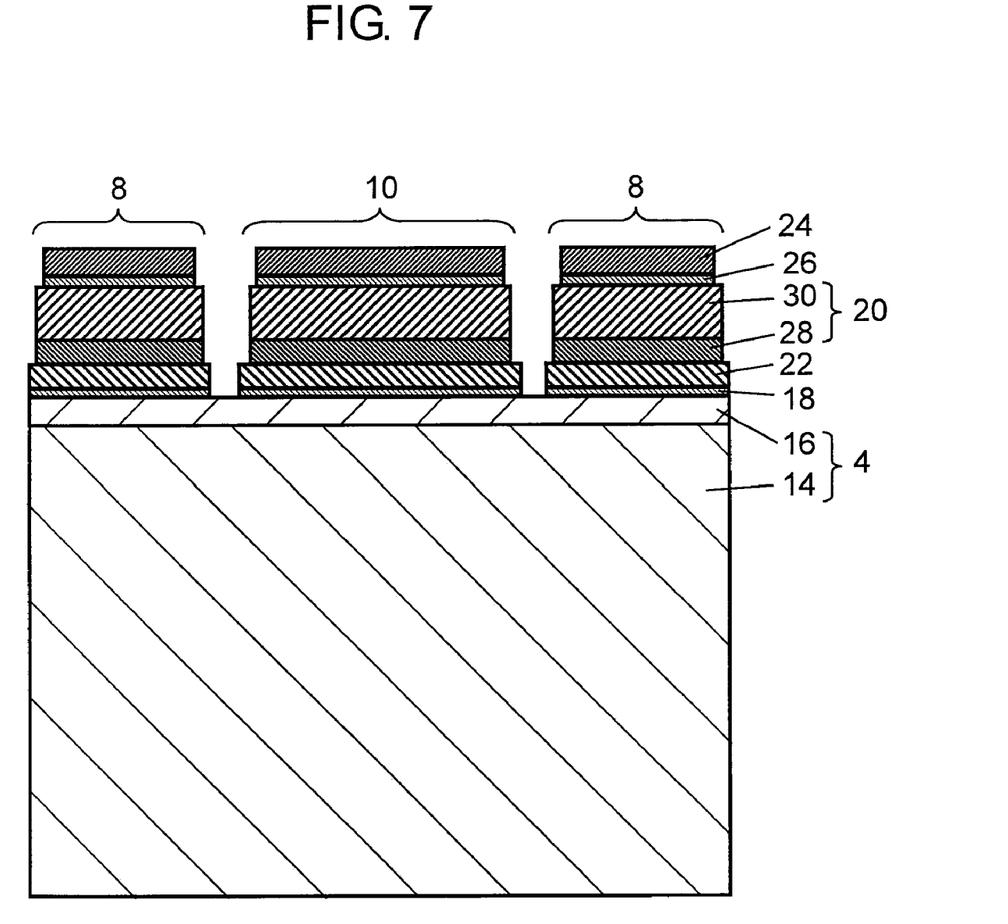
FIG. 7 shows a sectional view cut along line 7-7 in FIG. 6.

An angular velocity sensor disclosed in patent document 1 is described hereinafter with reference to FIG. 6 and FIG. 7 as one of conventional electronic components. FIG. 6 shows a perspective view of a detecting element of the conventional angular velocity sensor, and FIG. 7 shows a sectional view cut along line 7-7 in FIG. 6.

As shown in FIG. 6, the conventional angular velocity sensor comprises detecting element 2 shaped like a tuning fork and a signal processing circuit (not shown) which processes a signal supplied from detecting element 2 for calculating an angular velocity.

Detecting element 2 is formed of a pair of arms 4 confronting each other and supported by base 6, thereby shaping like a tuning fork. Base 6 in parts is mounted on a substrate. The pair of arms 4 comprises the following elements:

driving electrode 8 for supplying a driving signal which drives arms 4 to piezoelectric unit 20;

sensing electrode 10 for outputting an angular velocity signal generated by an angular velocity applied to detecting element 2; and detecting electrode 12 for detecting a driven status of detecting element 2, thereby outputting a detection signal.

Two driving electrodes 8 sandwich one sensing electrode 10 therebetween with respect to the face-to-face direction of arms 4 confronting each other. Detecting electrode 12 is placed closely to the border between arms 4 and base 6.

As shown in FIG. 7, two arms 4 is formed of a silicon substrate including two layers, i.e. silicon layer 14 and silicon oxide layer 16 that is formed by oxidizing the surface of silicon layer 14. On this silicon substrate, driving electrodes 8 and sensing electrodes 10 are respectively layered via first adhesive layers 18. Each one of driving electrodes 8 and sensing electrodes 10 is formed of lower electrode 22, upper electrode 24, and piezoelectric unit 20 existing between lower and upper electrodes 22 and 24. Second adhesive layer 26 is formed between piezoelectric unit 20 and upper electrode 24 for bonding these two elements together.

First adhesive layer 18 is formed of Ti-layer, and lower electrode 22 is formed of Pt—Ti layer including Ti and Pt as a main ingredient. Piezoelectric unit 20 is formed of two layers, i.e. orientation control layer 28 made of lead-titante based material, and PZT layer 30 made of lead zirconate titante. Second adhesive layer 26 is formed of Ti-layer, and upper electrode is formed of Au-layer.

Detecting element 2 discussed above can be manufactured with the following method: First, layer first adhesive layer 18 on a wafer-like silicon substrate, then layer lower electrode 22 onto first adhesive layer 18, and then layer orientation control layer 28 onto lower electrode 22, then layer PZT layer 30 onto orientation control layer 28, then layer second adhesive layer 26 onto PZT layer 30, and finally layer upper electrode 24 on second adhesive layer 26.

Second, provide the foregoing layers with dry-etching and wet-etching by using the photolithography method in order to form driving electrode 8, sensing electrode 10 and detecting electrode 12 in a given shape, and these electrodes are extended and routed, thereby forming signal paths 13.

Third, provide the foregoing product with a polarization process and an annealing process to stabilize PZT characteristics (polarization state) and secure other characteristics.

Next, provide the wafer-like silicon substrate with dry-etching to form multiple detecting elements 2 shaped like tuning forks, and then dice this substrate into discrete detecting elements 2.

Figure 8:
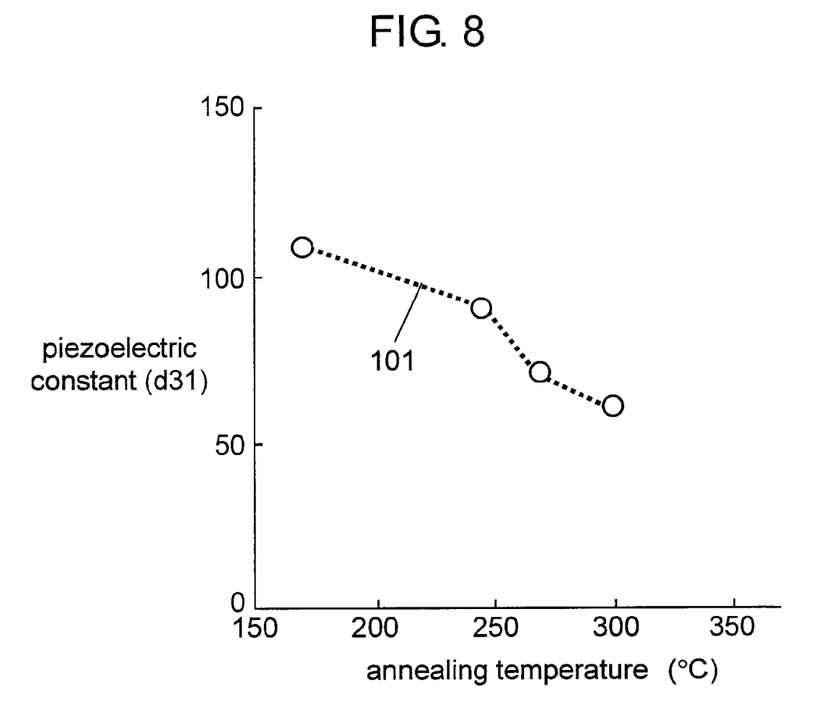
FIG. 8 shows characteristics of a piezoelectric layer made of PZT and used in the conventional detecting element.

The PZT characteristics of the foregoing detecting element 2 are shown in FIG. 8 with dotted line 101, and it tells that the reaction between Pb in PZT layer 30 and Ti in second adhesive layer 26 lowers the piezoelectric constant. A temperature-rise during the annealing process invites this reaction.

Figure 9:
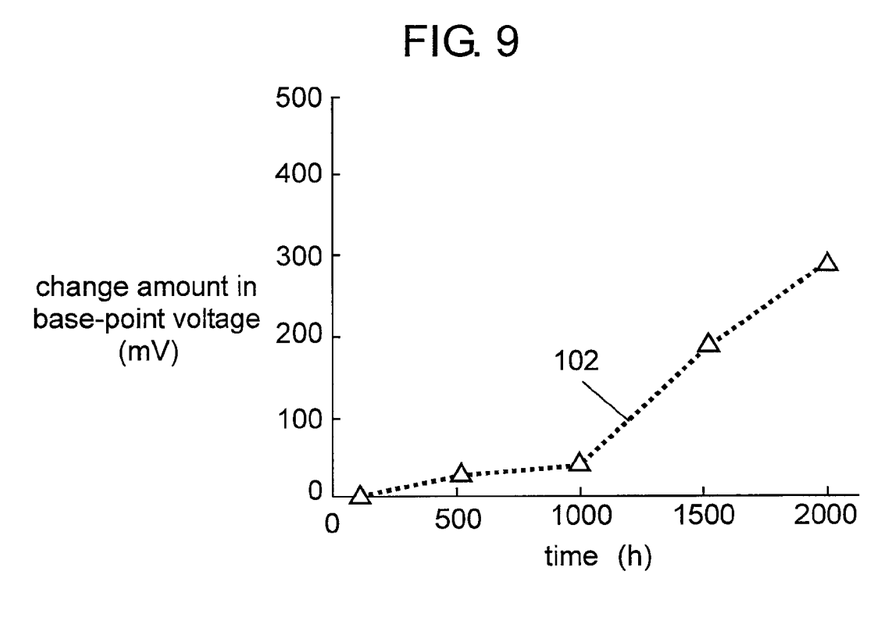
FIG. 9 shows characteristics of variation with time in the base-point voltage of the conventional angular velocity sensor working at a high temperature.

FIG. 9 shows variation with time in voltage at a base point of an angular velocity sensor during a high temperature. Dotted line 102 tells the following phenomenon: A longer time is taken by the angular velocity sensor employing the detecting element 2 discussed above during the high temperature (working on 5V at 125° C.), a greater change occurs in the base point voltage where no angular velocity is applied.

Figure 10:
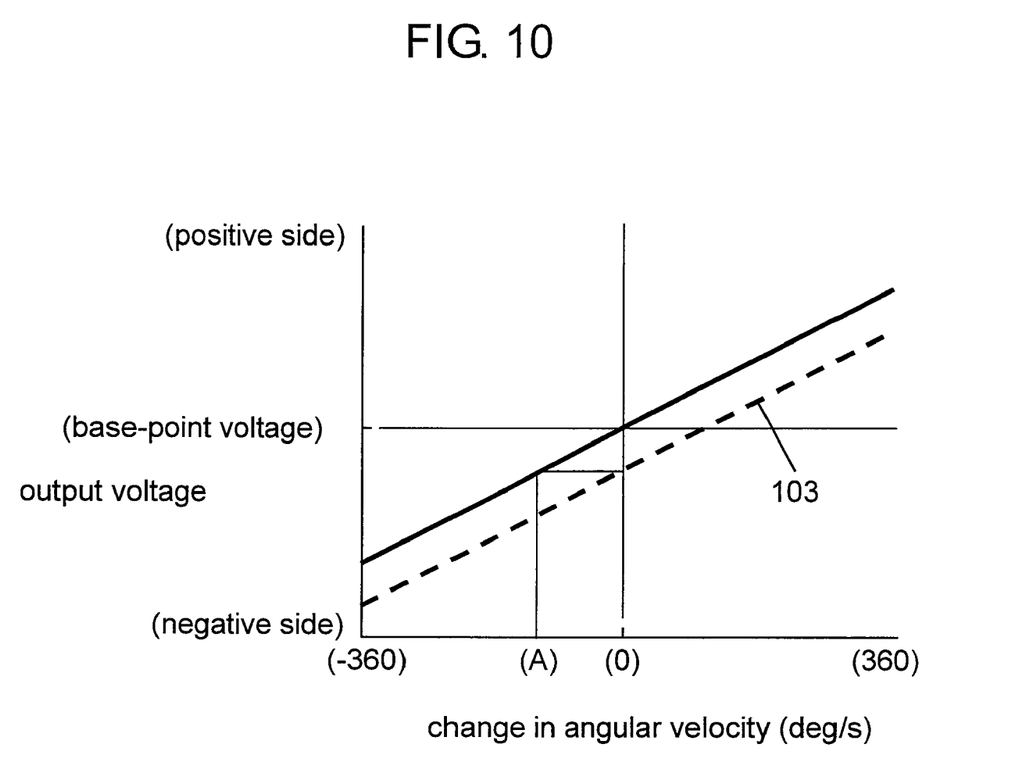
FIG. 10 shows characteristics of a change in an output voltage from the conventional angular velocity sensor in response to a change in angular velocity.

FIG. 10 shows a change in an output voltage from the foregoing angular velocity sensor in response to a change in angular velocity. As dotted line 103 tells, a voltage at the base point, where no angular velocity occurs, shifts to the negative side, thereby incurring an error (A) deg/s, which degrades the accuracy of the angular velocity sensor.

The foregoing conventional structure have invited the problems as discussed above, i.e. the temperature-rise during the annealing process invites lowering the piezoelectric constant, or a greater change in the base point voltage, where no angular velocity is applied, is caused by a longer working time when the sensor works at a high temperature. These problems degrade the characteristics of the sensor.

Patent Document 1: Unexamined Japanese Patent Application Publication No. 2002-257549

DISCLOSURE OF INVENTION

The present invention addresses the problems discussed above, and aims to provide an electronic component which prevents the piezoelectric constant from lowering as well as a change in the base-point voltage from varying, so that the characteristics of the electronic component can be improved. The present invention also provides a method for manufacturing the same electronic component.

The electronic component of the present invention includes an element having an electrode section, which comprises the following structural elements:

an upper electrode;
a lower electrode;
a piezoelectric unit disposed between the upper electrode and the lower electrode; and
an adhesive layer layered between the upper electrode and the piezoelectric unit.

The piezoelectric unit includes a piezoelectric layer made of piezoelectric material containing lead (Pb), and the adhesive layer includes a tungsten layer made of tungsten-based material. The piezoelectric layer and the tungsten layer are layered together.

The method of manufacturing the electronic component of the present invention comprises the step of forming an electrode section, and this step comprising the steps of:

layering the lower electrode on the element;
layering the piezoelectric unit, having the piezoelectric layer made of piezoelectric material containing lead, on the lower electrode;

forming the adhesive layer, having the tungsten layer made of tungsten-based material, such that the tungsten layer is layered on the piezoelectric layer; and layering the upper electrode on the adhesive layer.

The structure discussed above prevents the piezoelectric constant from lowering and the base-point voltage from varying. The lowering and the varying have been caused by the temperature rise.

DESCRIPTION OF REFERENCE MARKS 52 detecting element
54 arm
56 base
58 driving electrode
60 sensing electrode
62 detecting electrode
63 signal path
64 silicon layer
66 silicon oxide layer
68 first adhesive layer
70 piezoelectric unit
72 lower electrode
74 upper electrode
76 second adhesive layer
78 orientation control layer
80 piezoelectric layer

PREFERRED EMBODIMENT OF INVENTION

An exemplary embodiment of the present invention is demonstrated hereinafter with reference to the accompanying drawings.

Exemplary Embodiment

Figure 1:
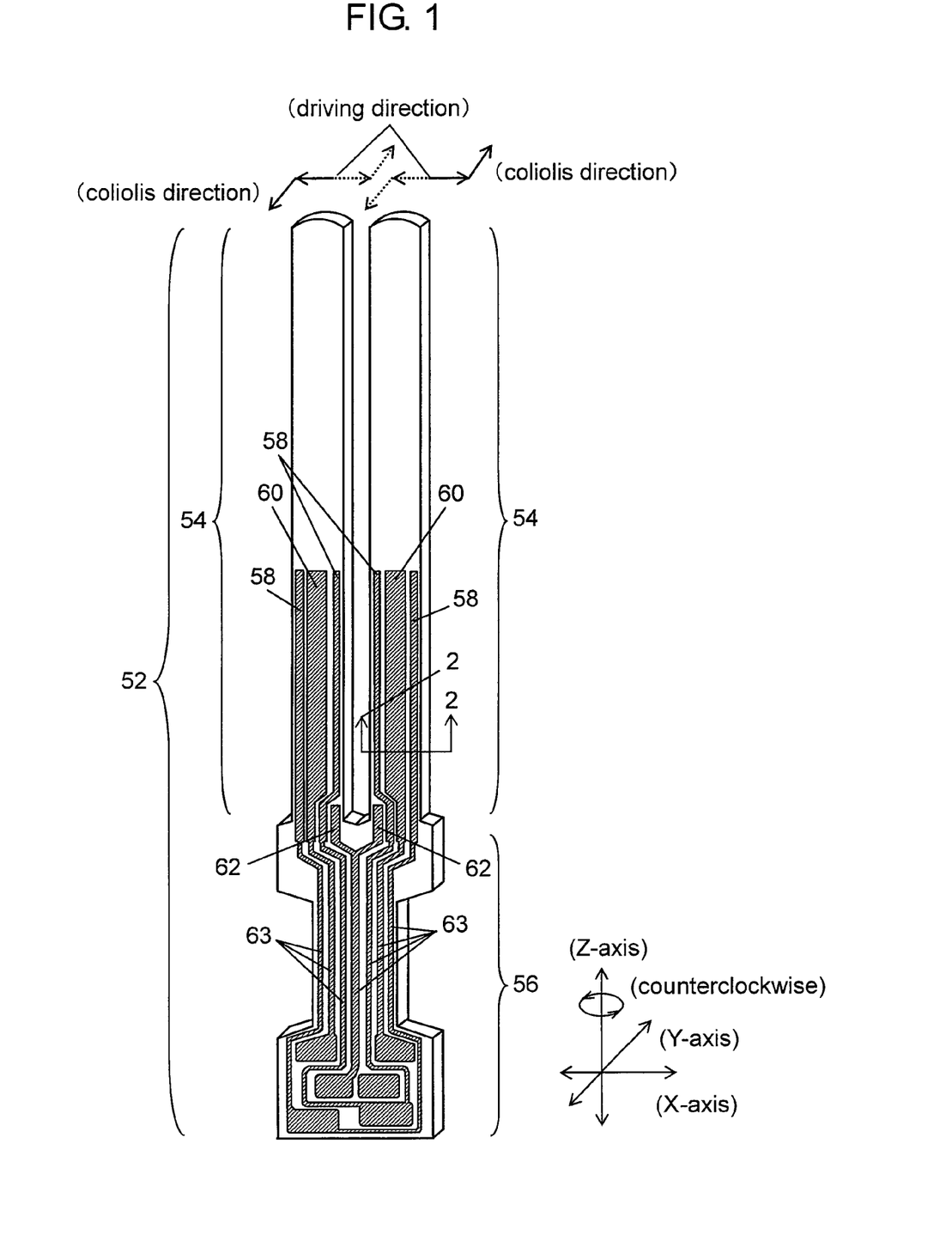
FIG. 1 shows a perspective view illustrating a detecting element of an angular velocity sensor in accordance with an exemplary embodiment of the present invention.
Figure 2:
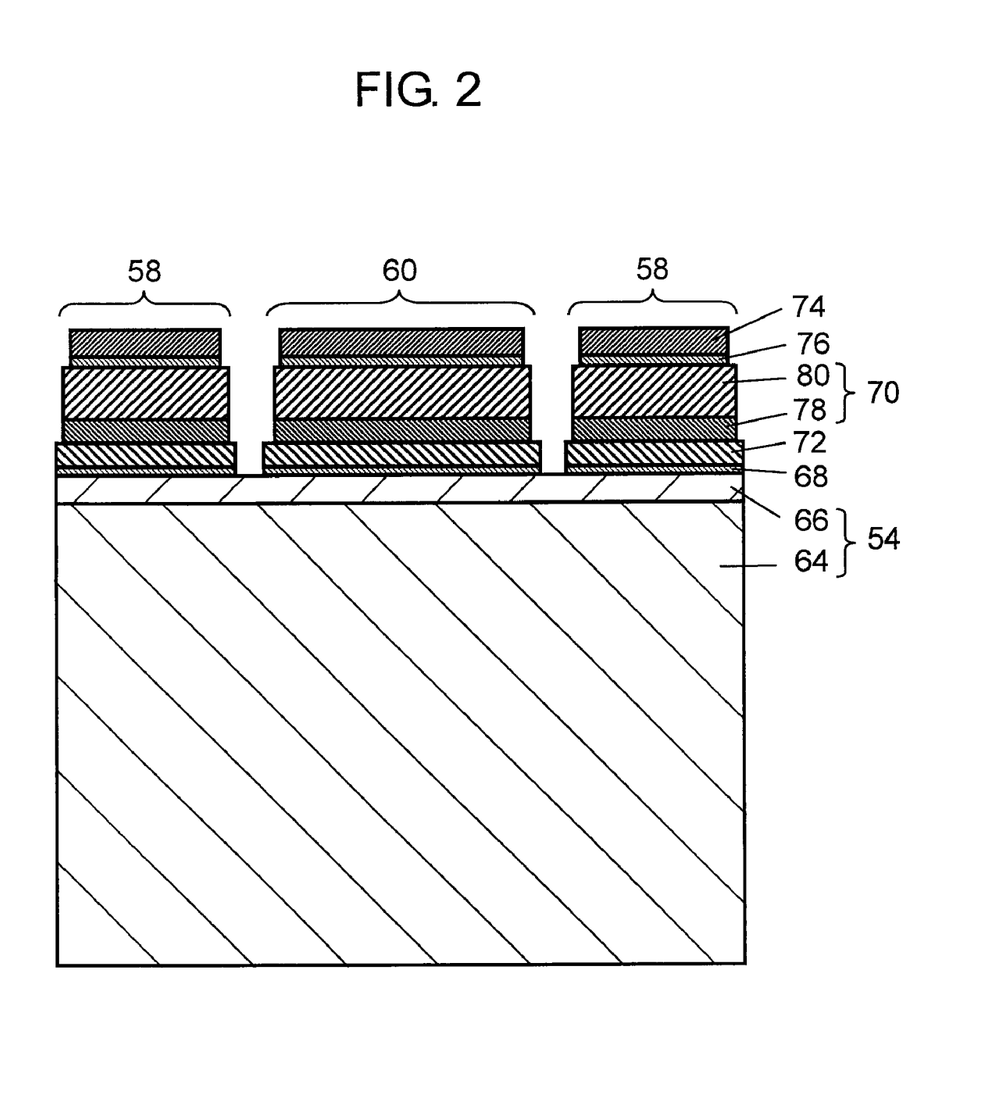
FIG. 2 shows a sectional view cut along line 2-2 in FIG. 1.

FIG. 1 shows a perspective view illustrating a detecting element of an angular velocity sensor in accordance with this exemplary embodiment of the present invention. FIG. 2 shows a sectional view cut along line 2-2 in FIG. 1.

In FIG. 1, the angular velocity sensor of the present invention comprises the following structural elements:

detecting element 52 shaped like a tuning fork; and a signal processing circuit (not shown) for processing a signal supplied from detecting element 52 and calculating an angular velocity.

Detecting element 52 is formed of a pair of flexible arms 54 confronting each other and supported by base 56, and is shaped like a tuning fork. Base 56 in parts is mounted on a substrate. The pair of arms 54 comprises the following elements:

driving electrodes 58 for receiving a driving signal which drives arms 54;

sensing electrode 60 for outputting an angular velocity signal generated by an angular velocity applied to detecting element 52; and detecting electrode 62 for detecting a driven status of detecting element 52, thereby outputting a detection signal.

Two driving electrodes 58 sandwich one sensing electrode 60 therebetween with respect to the face-to-face direction of arms 54 confronting each other. Detecting electrode 62 is placed closely to the border between arms 54 and base 56. Besides the foregoing structure, the foregoing electrodes 58, 60, and 62 are extended and routed respectively, thereby forming signal paths 63 (including electrode pads).

As shown in FIG. 2, each one of two arms 54 is formed of a silicon substrate including two layers, i.e. silicon layer 64 and silicon oxide layer 66 that is formed by oxidizing the surface of silicon layer 64. On this silicon substrate, driving electrodes 58, sensing electrodes 60, and detecting electrode 62 are independently layered via first adhesive layer 68. Each one of driving electrodes 58, sensing electrodes 60, and detecting electrode 62 is formed of lower electrode 72, upper electrode 74, and piezoelectric unit 70 existing between lower and upper electrodes 72 and 74. Second adhesive layer 76 is placed between piezoelectric unit 70 and upper electrode 74 for bonding these two elements together. Meanwhile detecting electrode 62 is constructed in a similar way to what is discussed above.

First adhesive layer 68 is formed of Ti layer of which main ingredient is titanium. Lower electrode 72 is formed of Pt—Ti layer containing titanium and made of Pt-based material. Piezoelectric unit 70 is formed of two layers, i.e. orientation control layer 78 of which main ingredient is lead titante, and piezoelectric layer 80 layered on orientation control layer 78 and made of piezoelectric material containing lead (Pb). Second adhesive layer 76 is formed of a tungsten layer of which main ingredient is tungsten, and upper electrode 74 is formed of Au layer of which main ingredient is Au (gold). Orientation control layer 78 employs PLMT (Lead Titante added with Lanthanum and Magnesium) or PLT (Lead Titante added with Lanthanum). Piezoelectric layer 80 made of piezoelectric material containing lead (Pb) employs PZT (Lead Zirconium Titante) of which main ingredient is lead zirconium titante, or PLZT (Lanthanum-modified Lead Zirconate Titante) of which main ingredient is lead zirconium titante added with lanthanum.

In detecting element 52 placed on X-axis, Y-axis, and Z-axis orthogonally crossed each other, supply of an AC signal to driving electrode 58 of arm 54 prompts arm 54 to drive and vibrate along the driving and vibrating direction. When detecting element 52 is placed such that arm 54 vibrates along X-axis, if angular velocity occurs on Z-axis, Coliolis force occurs on arms 54 along Y-axis, so that arms 54 are going to bend along Y-axis. Sensing electrode 60 senses this bend, thereby detecting an angular velocity signal.

A method for manufacturing the foregoing detecting element 52 comprises the following steps:

First, layer first adhesive layer 68 on a wafer-like substrate; then layer lower electrode 72 onto first adhesive layer 68, then layer orientation control layer 78 onto lower electrode 72, then layer piezoelectric layer 80 onto orientation control layer 78, then layer second adhesive layer 76 onto piezoelectric layer 80, and finally layer upper electrode 74 on second adhesive layer 76.

Second, provide the foregoing layers with dry-etching by using the photolithography method in order to form driving electrode 58, sensing electrode 60 and detecting electrode 62 in a given shape, and also form signal paths 63 by extending and routing the foregoing electrodes 58, 60 and 62. In this case, signal path 63 is not etched entirely so that the electrode section including the electrodes discussed above can be grounded via a part of signal path 63. After the electrode section is formed, wet etching is provided for removing a part of signal path 63, so that signal path 63 can be formed in a given shape.

Next, a polarization process and an annealing process are carried out, so that the characteristics (polarized status) of the piezoelectric layer formed of PZT can be stabilized, and other characteristics can be secured. Then provide the wafer-like silicon substrate with dry-etching to form multiple detecting elements 52 shaped like tuning forks, and then dice this substrate into discrete detecting elements 52.

Figure 3:
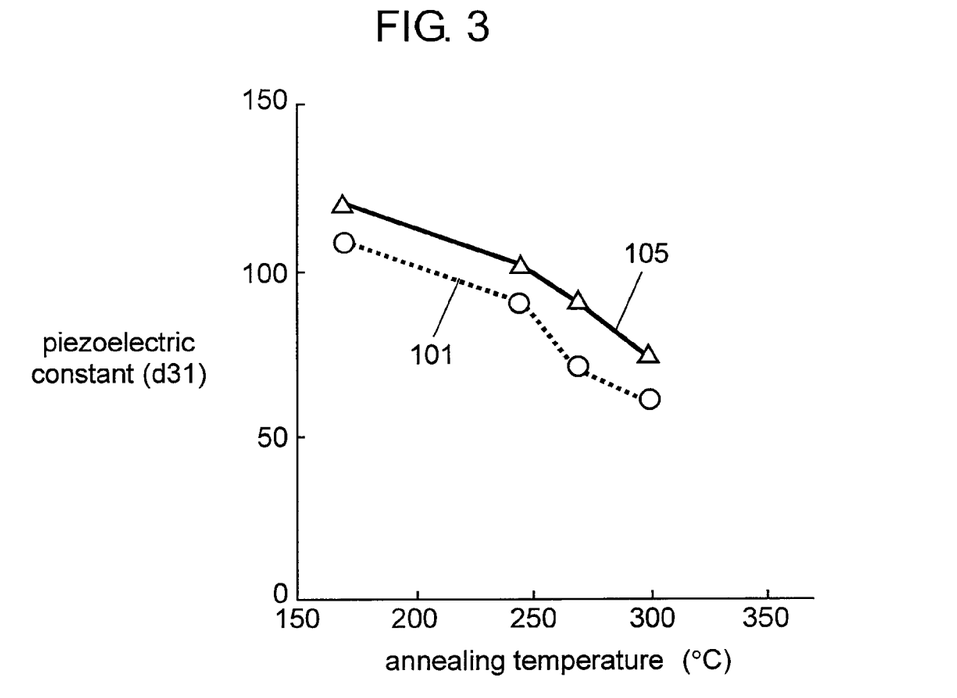
FIG. 3 shows characteristics of a piezoelectric layer made of PZT and used in the detecting element.

The piezoelectric characteristics of piezoelectric layer 80 formed of PZT of detecting element 52 discussed above are shown in FIG. 3 with dotted line 105, which tells that the reaction, caused by a temperature-rise during the annealing process, between lead and oxygen in piezoelectric layer 80 and the tungsten layer made of tungsten-based material of second adhesive layer 76 lowers the piezoelectric constant. However, this lowered amount is smaller than that of the conventional case shown with dotted line 101 in FIG. 8 where Ti is used in second adhesive layer 76.

Figure 4:
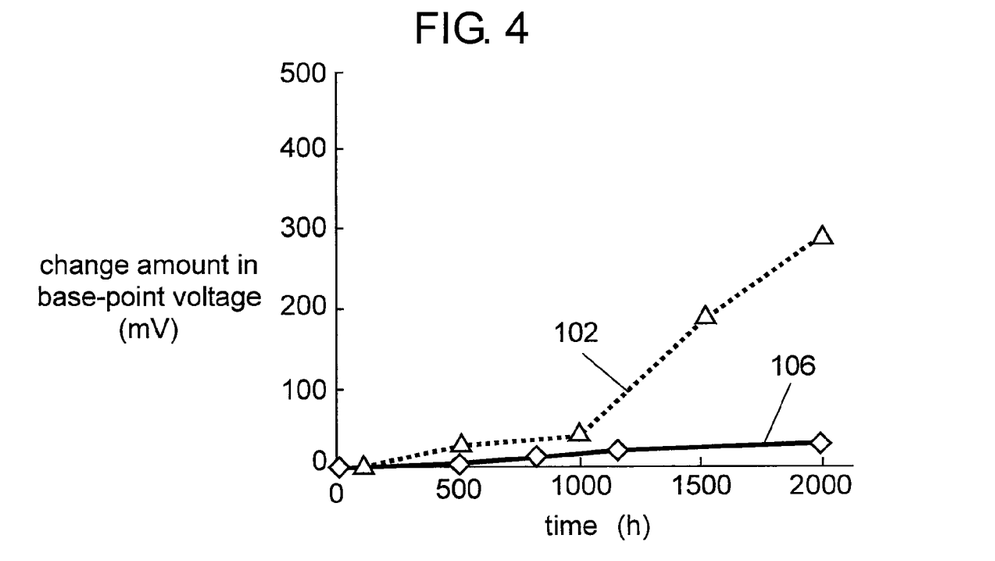
FIG. 4 shows characteristics of variation with time in the base-point voltage of the angular velocity sensor working at a high temperature.

FIG. 4 shows variation with time in a base-point voltage during a high temperature of the angular velocity sensor employing detecting element 52, and as dotted line 106 tells, as this angular velocity sensor takes a longer time during the high temperature (working on 5V at 125° C.), a greater change occurs in the base-point voltage where no angular velocity is applied. However, the changed amount in voltage is smaller than that of the conventional case shown with dotted line 102 in FIG. 9.

Figure 5:
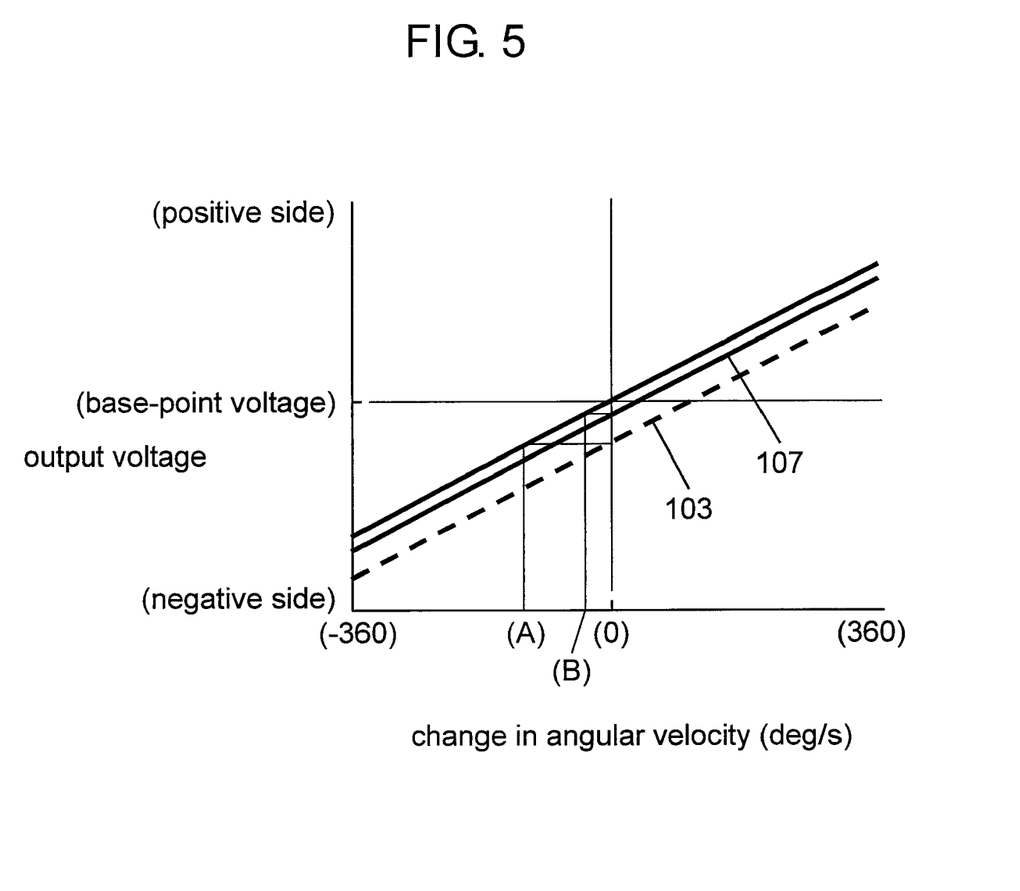
FIG. 5 shows characteristics of a change in an output voltage from the angular velocity sensor in response to a change in angular velocity.

FIG. 5 shows a change in an output voltage from the foregoing angular velocity sensor in response to a change in angular velocity. As dotted line 107 in FIG. 5 tells, a voltage at the base point, where no angular velocity occurs, shifts, e.g. to the negative side. The shifted amount (B) of deg/s is smaller than that of the conventional case, i.e. (A) deg/s shown with dotted line 103 in FIG. 10. The error is thus reduced from that of the conventional case, so that the angular velocity sensor can be prevented from degrading its accuracy.

The detecting element in accordance with this embodiment comprises the following structural elements:

upper electrode 74;

lower electrode 72;

piezoelectric unit 70 disposed between upper electrode 74 and lower electrode 72; and second adhesive layer 76 bonding upper electrode 74 to piezoelectric unit 70.

Piezoelectric unit 70 includes piezoelectric layer 80 made of piezoelectric material containing lead (Pb), and second adhesive layer 76 includes the tungsten layer made of tungsten-based material. Piezoelectric layer 80 and the tungsten layer are layered together. This structure prevents the piezoelectric constant from lowering and the base-point voltage from varying. The lowering and the varying have been caused by the temperature rise.

Second adhesive layer 76, formed of the tungsten layer of which main ingredient is tungsten, is wet-etched to form into a given shape. This structure can prevent the piezoelectric characteristics of piezoelectric layer 80 from degrading.

To be more specific, driving electrode 58, sensing electrode 60 and detecting electrode 62 are dry-etched to form into predetermined shapes. At this time, electric charges are charged in those electrodes, thereby degrading the piezoelectric characteristics of piezoelectric layer 80. To prevent this problem, these electrodes are electrically grounded, so that electric charges cannot be charged in the electrodes. Respective electrodes 58, 60, and 62 are extended and routed, thereby forming signal paths 63, and at least parts of signal paths 63 are grounded, and at least parts of signal paths 63 are wet-etched to form into a predetermined shape. This structure prevents the piezoelectric characteristics from degrading while the electrodes 58, 60, 62 and signal paths 63 can be formed in predetermined shapes.

Since the electrodes are extended and routed, thereby forming signal paths 63 which are to be wet-etched, second adhesive layer 76 in particular is preferably made of the material allowing the wet-etch. The material good for the wet-etch includes, e.g. Cr, Al or Ti; however, these materials are not good for being used in detecting element 52 of the angular velocity sensor because they react with piezoelectric layer 80 during a temperature-rise in the annealing process, thereby degrading the characteristics. The material such as Ru, Mo, or Ta resists reacting with piezoelectric layer 80; however, these materials are not good too because they do not allow the wet-etch. Tungsten is one of the materials which allow the wet-etch and resist reacting with piezoelectric layer 80.

INDUSTRIAL APPLICABILITY

The electronic component of the present invention prevents the piezoelectric constant from lowering as well as a change in the base-point voltage from increasing, so that an improvement of the characteristics of the electronic component can be expected. The electronic component is thus useful for a variety of electronic devices.

The invention claimed is:

1. An electronic component comprising an element including an electrode section which comprises:

an upper electrode;

a lower electrode;

a piezoelectric unit disposed between the upper electrode and the lower electrode; and an adhesive layer layered between the upper electrode and the piezoelectric unit, wherein the piezoelectric unit includes a piezoelectric layer made of piezoelectric material containing lead (Pb), and the adhesive layer includes a tungsten layer made of tungsten-based material, wherein the piezoelectric layer and the tungsten layer are layered together.

2. The electronic component of claim 1, wherein the element is formed of a flexible arm, wherein the electrode section includes a driving electrode for driving and vibrating the arm, and a sensing electrode for sensing a bend of the arm, and both of the electrodes are formed on the arm, wherein the element detects angular velocity.

3. The electronic component of claim 2, wherein the element includes a signal path formed by extending and routing the electrode section, wherein the electrode section is formed by dry etching, and at least parts of the signal path are formed by wet etching.

4. A method of manufacturing an electronic component, the method comprising a step of forming an electrode section, the step comprising the steps of:

layering a lower electrode on an element;

layering a piezoelectric unit, having a piezoelectric layer made of piezoelectric material containing lead, on the lower electrode;

forming an adhesive layer, having a tungsten layer made of tungsten-based material, such that the tungsten layer is layered on the piezoelectric layer; and layering an upper electrode on the adhesive layer.

5. The method of manufacturing the electronic component as defined in claim 4 further comprising the step of manufacturing an element formed of a flexible arm, wherein the step of forming the electrode section includes the step of:

forming the electrode section on the arm for driving and vibrating the arm, and the other electrode section on the arm for sensing a bend of the arm.

6. The method of manufacturing the electronic component as defined in claim 5 further comprising the step of forming a signal path on the element by extending the electrode section, wherein the step of forming the electrode section forms the electrode section by using dry etching, and then the step of forming the signal path forms at least parts of the signal path by using wet etching.

* * * * *